(12) United States Patent
Kaveh et al.

(10) Patent No.: US 6,364,762 B1
(45) Date of Patent: Apr. 2, 2002

(54) WAFER ATMOSPHERIC TRANSPORT MODULE HAVING A CONTROLLED MINI-ENVIRONMENT

(75) Inventors: Farro F. Kaveh, Palo Alto; David E. Jacob, Fremont; Dean Jay Larson, Santa Clara; Martin R. Maraschin, Pleasanton, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/410,190

(22) Filed: Sep. 30, 1999

(51) Int. Cl.$^7$ .................................................. B01L 1/04
(52) U.S. Cl. ......................... 454/187; 454/52; 454/57; 55/385.2
(58) Field of Search ............................ 454/187, 49, 51, 454/52, 56, 57, 60; 414/217, 935, 939; 55/385.1, 385.2, DIG. 18, DIG. 29

(56) References Cited

U.S. PATENT DOCUMENTS

| | | | |
|---|---|---|---|
| 4,660,464 A | * 4/1987 | Tanaka | 454/187 |
| 4,693,173 A | * 9/1987 | Saiki et al. | 454/187 |
| 4,723,480 A | * 2/1988 | Yagi et al. | 454/57 |
| 4,813,846 A | 3/1989 | Helms | 414/744.1 |
| 5,217,501 A | 6/1993 | Fuse et al. | |
| 5,344,615 A | * 9/1994 | Yanagi et al. | 454/49 |
| 5,435,683 A | 7/1995 | Oosawa et al. | |
| 5,553,496 A | * 9/1996 | Nishiyama et al. | 454/187 |
| 5,671,764 A | 9/1997 | Murakami et al. | 134/200 |
| 5,697,759 A | 12/1997 | Bacchi et al. | 414/786 |
| 5,829,939 A | 11/1998 | Iwai et al. | 414/411 |
| 5,833,726 A | * 11/1998 | Kinkead et al. | 454/187 |
| 5,980,684 A | 11/1999 | Hori et al. | 156/345 |
| 6,097,469 A | * 8/2000 | Yaegashi et al. | 454/187 |

FOREIGN PATENT DOCUMENTS

| | | | |
|---|---|---|---|
| EP | 0 786 800 A2 | 7/1997 | H01L/21/00 |
| EP | 10312942 | 11/1998 | H01L/21/02 |
| WO | WO 99/03133 | 1/1999 | H01L/21/00 |
| WO | WO99/13504 | 3/1999 | |

* cited by examiner

Primary Examiner—Jiping Lu
(74) Attorney, Agent, or Firm—Martine & Penilla, LLP

(57) ABSTRACT

An atmospheric transport module is provided. The module includes an enclosed housing having a top region, a central region, a bottom region, and a load cell region. A blower is located in the top region of the enclosed housing and is configured to generate a flow of air downward into the central region. A shelf in the load cell region defines a separation between the central region and the bottom region of the enclosed housing. The shelf is at least partially spaced apart from a wall of the load cell region to thereby define a slot behind the shelf. A perforated sheet is configured to extend horizontally from the shelf and further define the separation between the central region and the bottom region. In this example, air flow generated by the blower is restricted from freely flowing through the perforated sheet and is partially caused to be redirected toward the shelf of the load cell, through the slot and into the bottom region of the enclosure housing. A cassette having one or more wafers is configured to sit on the shelf in the load cell and thus be subjected to the redirected air flow. This redirected air flow will thus gently flow over the surfaces of the wafers and assist in removing post-process gases and particles from over the wafer surfaces while the wafers temporarily sit in the atmospheric transport module.

32 Claims, 7 Drawing Sheets

WAFER ATMOSPHERIC TRANSPORT MODULE HAVING A CONTROLLED MINI-ENVIRONMENT

BACKGROUND OF THE INVENTION

1. Field of the Invention

The present invention relates generally to transferring wafers among modules of semiconductor processing equipment, and more particularly to a module having a controllable mini-environment.

2. Description of the Related Art

In the manufacture of semiconductor devices, process chambers are interfaced to permit transfer of wafers or substrates, for example, between the interfaced chambers. Such transfer is via transport modules that move the wafers, for example, through slots or ports that are provided in the adjacent walls of the interfaced chambers. For example, transport modules are generally used in conjunction with a variety of substrate processing modules, which may include semiconductor etching systems, material deposition systems, and flat panel display etching systems. Due to the growing demands for cleanliness and high processing precision, there has been a growing need to reduce the amount of human interaction during and between processing steps. This need has been partially met with the implementation of vacuum transport modules which operate as an intermediate handling apparatus (typically maintained at a reduced pressure, e.g., vacuum conditions). By way of example, a vacuum transport module may be physically located between one or more clean room storage facilities where substrates are stored, and multiple substrate processing modules where the substrates are actually processed, e.g., etched or have deposition performed thereon. In this manner, when a substrate is required for processing, a robot arm located within the transport module may be employed to retrieve a selected substrate from a load lock chamber and place it into one of the multiple processing modules.

As is well known to those skilled in the art, the arrangement of transport modules to "transport" substrates among multiple storage facilities and processing modules is frequently referred to as a "cluster tool architecture" system. FIG. 1A depicts a typical semiconductor process cluster architecture 100 illustrating the various chambers that interface with a vacuum transport module 106. Vacuum transport module 106 is shown coupled to three processing modules 108a–108c which may be individually optimized to perform various fabrication processes. By way of example, processing modules 108a–108c may be implemented to perform transformer coupled plasma (TCP) substrate etching, layer depositions, and/or sputtering.

Connected to vacuum transport module 106 is a load lock 104 that may be implemented to introduce substrates into vacuum transport module 106. The load lock 104 can be coupled to an atmospheric transport module (ATM) 103 that interfaces with the clean room 102. The ATM 103 typically has region for holding cassettes of wafers and a robot that retrieves the wafers form the cassettes and moves them into and out of the load lock 104. As is well known, the load lock 104 serves as a pressure-varying interface between vacuum transport module 106 and the ATM 103. Therefore, vacuum transport module 106 may be kept at a constant pressure (e.g., vacuum), while the ATM 103 and clean room 102 are kept at atmospheric pressure.

FIG. 1B illustrates a partial system diagram 150 including an atmospheric transport module (ATM) 103 which includes a filter/blower 152a, a robot 156 having an arm set 158, and a shelf 154. The shelf 154 is configured to hold a cassette 160 of wafers 162 within a cassette environment 152b. The cassette environment 152b of the ATM 103 has a door 155 which can be opened to insert or remove the cassette 160 during processing. The filter/blower 152a is configured to generate an air flow 170 in the ATM 103 and thus, cause the air flow substantially undisturbed through a particle screen 171 to a lower portion of the ATM 103 and then out an exhaust vent 152c. In addition, the ATM 103 is simplistically shown connected to the load lock 104 and to the transport module 106. As mentioned above, the transport module 106 can then transfer wafers between selected processing modules 108.

Although this type of prior art ATM 103 is capable of transferring wafers from the cassette 160 into and out of the load lock 104 quite efficiently, the air flow 170 has been observed to bypass the cassette environment 152b during the operation of the blower 152a. As a result, the cassette environment 152b remains substantially static. That is, the environment between the wafers 162 remains substantially unaffected by the air flow 170 during operation.

FIG. 1C illustrates a more detailed view of the cassette 160 having a plurality of wafers 162. In general, after a wafer has been processed in one of the processing modules 108 and stacked back into the cassette 160, post-process gasses will typically hover between the respective wafers 162. The gasses are pictorially illustrated by 166 emanating from the top surfaces of recently processed wafers 162. A problem with having such gasses 166 between the wafers 162 is that the chemical gasses can, in some cases, continue to chemically react and cause degradation in the yield of the processed wafers 162. If wafers are degraded sufficiently, the potential financial loss associated with reduced yields can be significant.

Another problem with having a stagnant cassette environment 152b is that any particles that may have fallen onto the surfaces of the wafers 162 will continue to remain on the top surfaces of the wafer while the cassette rests in the cassette environment 152b. These particles 164, in some cases can cause substantial damage to the semiconductor circuits formed on the wafers 162. It is well known that it is undesirable to allow particles 164 to remain on the surface of the wafers 162 in between the processing operations. The longer the particles remain on the surface of the wafers 162, the higher the probability that such particles will cause damage to sensitive integrated circuitry, and will be harder to clean.

Still another problem with having cassettes 160 sit in static environment 152b is that once a process engineer opens door 155 to remove the cassette 160, the cassette 160 may expose the process engineer to potentially undesirable levels of toxic gasses 166 that emanate from the surfaces of the wafers 162. In some cases, such exposure to process gasses and chemical by-products can cause process engineers handling such cassettes to become disoriented and thus potentially drop the cassette 160 full of valuable processed semiconductor wafers 162.

In view of the foregoing, what is needed is an atmospheric transport module that is capable of controlling the environment in and around a cassette of wafers.

SUMMARY OF THE INVENTION

Broadly speaking, the present invention fills these needs by providing an atmospheric transport module capable of generating a mini-environment in a region where cassettes of wafers are temporarily stored during processing. The mini-environment is preferably configured to define an air flow through the wafers such that process gases and by-products are substantially purged away from the environment surrounding the wafers. It should be appreciated that the present invention can be implemented in numerous ways, including as a process, an apparatus, a system, a device, or a method. Several inventive embodiments of the present invention are described below.

In one embodiment, an atmospheric transport module is disclosed. The module has a housing and the housing includes a number of inventive elements. The housing has a top portion that contains a blower for generating a regulated air flow in a downward direction that is away from the top portion of the housing. A load cell region is also included and it is laterally offset from the blower. The load cell includes a shelf for supporting a wafer cassette and the shelf is separated from a wall of the load cell to thus define a redirection air flow slot. A perforated sheet is defined below the blower, and the perforated sheet is configured to restrict air flow through the perforated sheet and induce a redirected air flow through the wafer cassette that sits on the laterally offset load cell. An advantage of the redirected air flow is that residual process gasses that may be hovering over the wafers in the wafer cassette are pushed away from the wafer cassette and down the redirection air flow slot. Another advantage is that when the doors are opened, air will flow out, reducing the chance that particles from outside will move in.

In another embodiment, an atmospheric transport module is disclosed. The module includes an enclosed housing having a top region, a central region, a bottom region, and a load cell region. A blower is located in the top region of the enclosed housing and is configured to generate a flow of air downward into the central region. A shelf in the load cell region defines a separation between the central region and the bottom region of the enclosed housing. The shelf is at least partially spaced apart from a wall of the load cell region to thereby define a slot behind the shelf. A perforated sheet is configured to extend from the shelf and further define the separation between the central region and the bottom region. In this embodiment, air flow generated by the blower is restricted from freely flowing through the perforated sheet and is partially caused to be redirected toward the shelf of the load cell, through the slot and into the bottom region of the enclosure housing.

Once the redirected air flow and the non-redirected air flow (flowing through the perforated sheet) enters the bottom region, the air is channeled out through a vent. In an alternative embodiment, a fan can be installed in the bottom region to assist the redirected air flow through the slot that is defined behind the shelf. In this manner, when a cassette having one or more wafers sits on the shelf in the load cell region, the redirected air flow will be caused to circulate any post-process gases and particles that may be present over the wafers. The post-process gases and any particles are thus caused to flow out to the bottom region of the enclosed housing and out the vent. In this embodiment, the fan is preferably interlocked to the door(s) of the load cell so that the fan switches off when any one of the doors of the load cell is opened. In this manner, dirty air is not pulled into the ATM by the fan when the door opens, thus contaminating the wafers.

In yet another embodiment, a method of making an atmospheric transport module is disclosed. The method includes forming an enclosed housing having a top region, a central region, a bottom region, and a load cell region. A blower is installed in the top region of the enclosed housing, and the blower is configured to generate a flow of air downward into the central region. A shelf is installed in the load cell region and the shelf defines a separation between the central region and the bottom region of the enclosed housing. The shelf is at least partially spaced apart from a wall of the load cell region and thereby defines a slot behind the shelf. A perforated sheet is installed in a manner that extends horizontally from the shelf and further defines the separation between the central region and the bottom region. The air flow generated by the blower is restricted from freely flowing through the perforated sheet and is partially caused to be redirected away from the perforated sheet and toward the shelf of the load cell, through the slot and into the bottom region of the enclosure housing.

A wafer cassette having one or more wafers is configured to sit on the shelf of the load cell and thus receive the redirected air flow. The redirected air flow therefore keeps a gentle flow of air flowing over any wafers that may be temporarily stored in the wafer cassette. The shelf can be configured to hold more than one wafer cassette, and an isolating enclosure can be built around each wafer cassette to maintain a stable mini-environment when a door behind the shelf is opened to access a particular one of the wafer cassettes.

Advantageously, the gentle flow of redirected air over the wafers ensures that wafers sitting in the load cell are not sitting in a static environment and thus cause the build up of post-process gases. The gentle flow of redirected air also assists in removing microscopic particles from over the wafers sitting in the cassettes, thus maintaining a controlled mini-environment that fosters higher yields and higher quality processed wafers. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention is described for an atmospheric transport module that is capable of generating a mini-environment in a region where cassettes of wafers are temporarily stored during processing. The mini-environment is preferably configured to include an air flow through and substantially parallel to the wafers, such that process gases and by-products are substantially purged away from between wafers sitting in a cassette. It will be obvious, however, to one skilled in the art, that the present invention may be practiced without some or all of these specific details. In other instances, well known process operations have not been described in detail in order not to obscure the present invention.

Figure 1A:
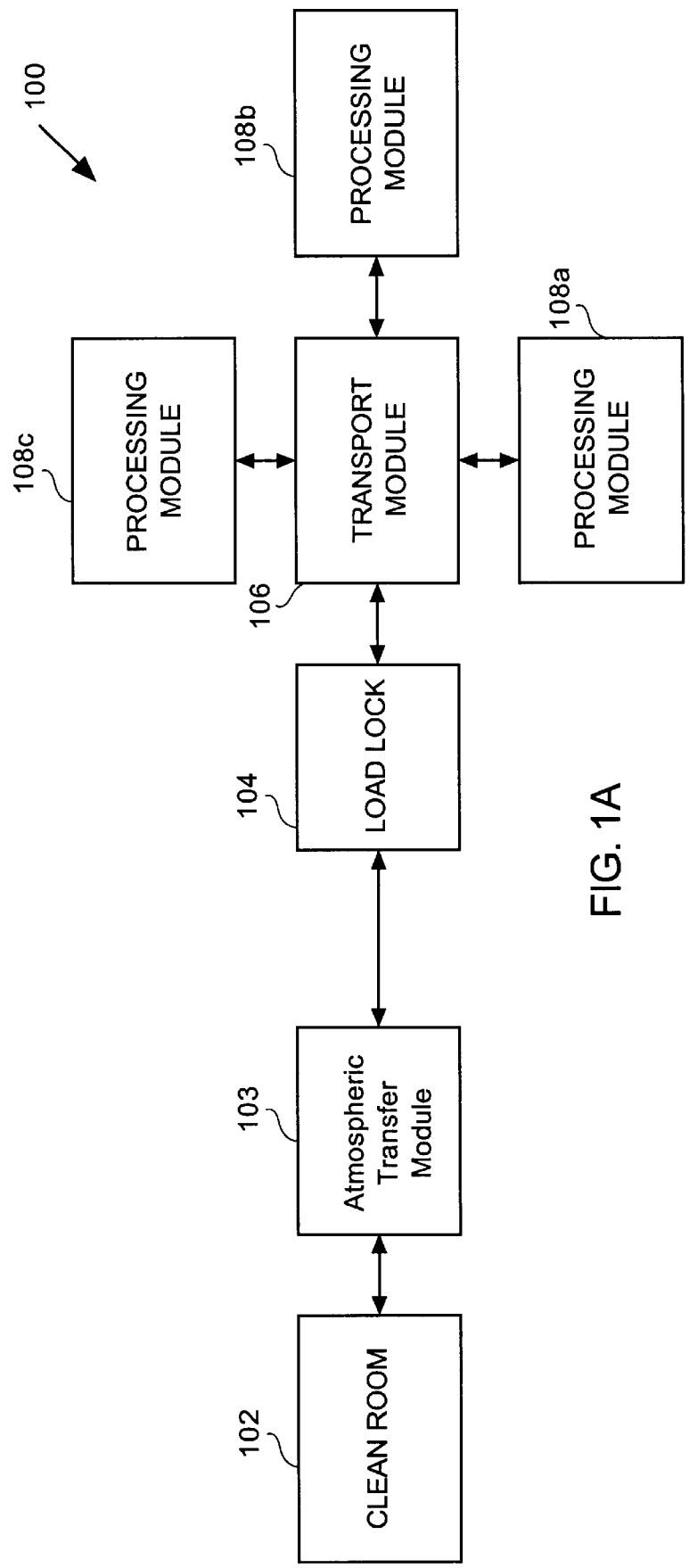
FIG. 1A depicts a typical prior art semiconductor process cluster tool architecture illustrating an atmospheric transport module that interfaces with a vacuum transport module, wherein a load lock receives wafers for transfer to the vacuum transport module.
Figure 1B:
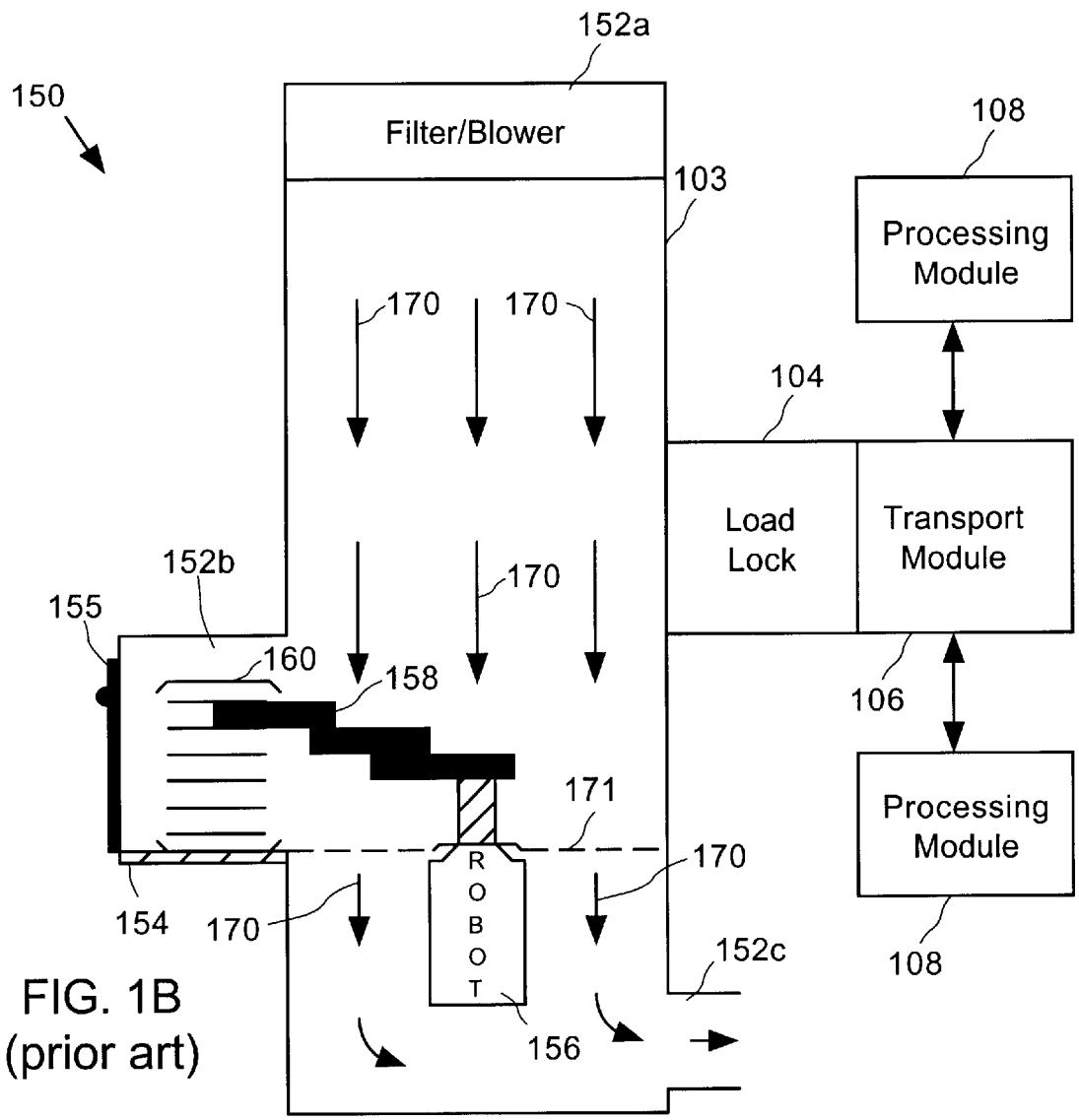
FIGS. 1B and 1C illustrate a partial system diagram including an atmospheric transport module (ATM) and a cassette.
Figure 1C:
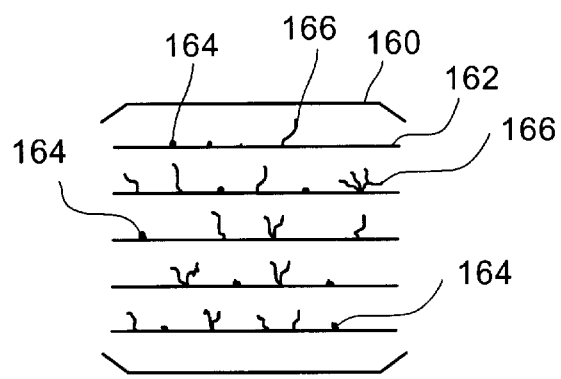
Figure 2A:
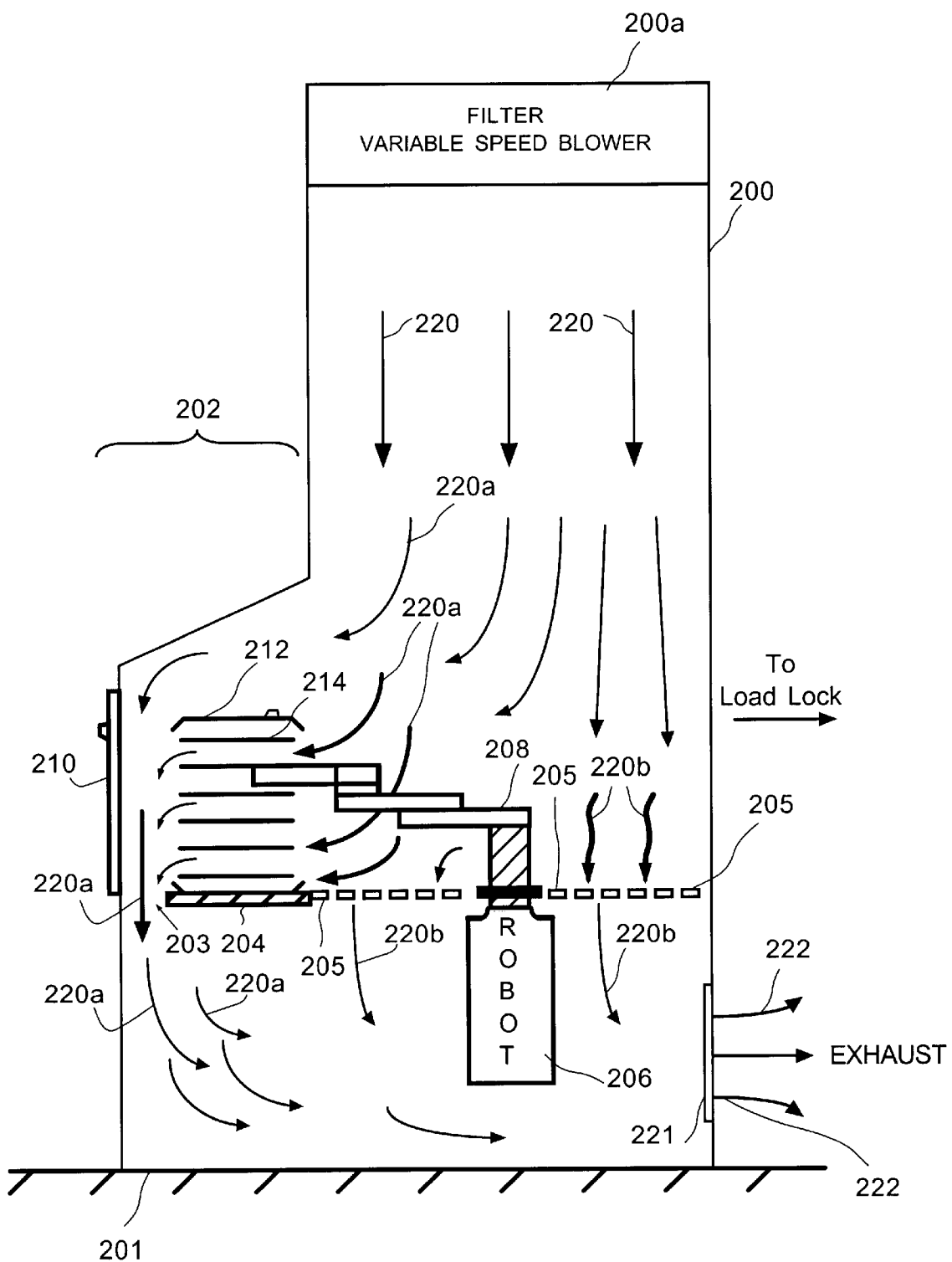
FIG. 2A illustrates an atmospheric transport module (ATM) that can sit on a clean room floor and interface with load lock chambers, in accordance with one embodiment of the present invention.

FIG. 2A illustrates an atmospheric transport module (ATM) 200 that can sit on a clean room floor 201, in accordance with one embodiment of the present invention. The ATM 200 includes a top portion that includes a filter and a variable speed blower. Alternatively, the variable speed blower can be fixed speed blower, and the separator 205 can include a built-in damper to adjust the air flow. Also included as part of the ATM 200 is a load cell 202 which is configured to hold one or more cassettes 212 of wafers 214. In this example, the cassette 212 is an open cassette that can hold multiple wafers of any particular size. By way of example, the cassettes 212 can be configured to hold 200 millimeter wafers, 300 millimeter wafers, as well as smaller than 200 millimeter and larger than 300 millimeter wafers. One exemplary manufacturer of open cassettes 212 is Fluoroware, Inc. of Chaska, Minn.

The ATM 200 is configured to hold a robot 206 having an arm set 208 for handling and transferring wafers between the cassette 212 and an adjacent load lock (not shown). The cassette 212 preferably sits on a shelf 204 which defines a re-direction air flow slot 203 between the shelf 204 and a back wall of the ATM 200 in the load cell region. At about the same level of the shelf 204 and horizontally extending from the shelf 204, a perforated sheet 205 separates the arm set 208 from the robot 206. In general, the perforated sheet 205 is configured to define a separation between a more clean region where wafers are temporarily stored, handled, and transferred, and a lower region where the robot motor resides.

In a preferred embodiment, the inner walls of the ATM 200 above the perforated sheet 205 (i.e., the clean center region of the ATM 200) are electro-polished stainless steel to prevent corrosion of the walls as well as to prevent charge buildup that may damage sensitive micro-devices on the wafers 214. The perforated sheet 205 is also preferably electro-polished stainless steel, while the walls below the perforated sheet 205 can be powder coated steel. The possibility of charge buildup below the perforated sheet and the shelf 204 are generally not a problem because the wafers are maintained above the level of the perforated sheet 205. The ATM 200 is also shown having a door 210 (or doors) which can be opened to insert and remove the cassettes 212 from within the ATM 200. Below the perforated sheet 205 is a vent 221 which allows exhaust 222 to be channeled into the clean room and out of the housing enclosure of the ATM 200. If needed, the vent 221 can be fitted with a damper to prevent too much air from rushing out or in the ATM 200. Still further, the vent can also come out of the bottom of the ATM 200.

The filter in top portion 200a can be any suitable filter capable of producing good efficiency, such as, for example about 99.9995% at 0.1 micron. One exemplary filter is an American air filter with boronsilicate glass fibers, which can be obtained from American Air Filter, International of Louisville, Ky. Similarly, the blower can be any suitable variable speed blower (or a fixed speed blower) which can be used in clean room environments. One exemplary variable speed blower is a squirrel cage blower RH31M-4/104371 which is available from EBM Industries of Farmington, Conn. The variable speed blower will therefore generate a regulated air flow 220 through the filter that is initially directed downward toward the perforated sheet, arm set 208, and cassette 212.

In one embodiment, the perforated sheet 205 is calibrated with openings (of any desired shape) to enable a particular amount of air flow through the perforated sheets and thus, create a redirected air flow 220a. The redirected air flow 220a is believed to be generated because the perforated sheet 205 at least partially restricts the flow of air (i.e., non-redirected air flow 220b) through the perforated sheet 205 and into a lower region of the ATM 200.

As pictorially illustrated, the redirected air flow 220a will curve toward the load cell 202 and create a mini-environment in and around the cassette 212. The redirected air flow 220a will thus at least partially flow parallel and through the wafers 214 and then channel downward through the redirection air flow slot 203. Advantageously, the mini-environment generated by the redirected air flow through the wafers 214 of the cassette 212 will assist in removing stagnant gasses and particles from the surfaces of the wafers 214 while they sit in the load cell 202. Of course, part of the regulated air flow 220 will flow through the perforated sheet 205 as non-redirected air flow 220b. Both the redirected air flow 220a that passes through the redirection air flow slot 203 and the non-redirected air flow 220b that flows through the perforated sheet 205 will exit the vent 221 in the lower region of the ATM 200 enclosure housing and is represented as exhaust 222.

As illustrated in Table A below, the regulated air flow 220 will flow, in one embodiment, at a mean velocity of between about 40 ft. per minute and about 120 ft. per minute through the perforated sheet 205, while the redirected air flow 220a will gently flow through the wafers 214 at a mean velocity ranging between about 10 ft. per minute and about 80 ft. per minute. The exemplary mean velocities of Table A are for a case where the doors 210 of the load cell 202 are closed. For cases in which at least one of the doors 210 of the load cell 202 is open, the exemplary mean velocities of the air flows are provided in Table B.

TABLE A

| EXEMPLARY AIR FLOW CALIBRATION | | |
|---|---|---|
| ATM Cassette<br>Doors Closed | Redirected<br>Air Flow | Non-Redirected<br>Air Flow |
| Preferred Range | ~10–80 ft/min | ~40–120 ft/min |
| More Preferred<br>Range | ~20–40 ft/min | ~50–80 ft/min |
| Most Preferred | ~30 ft/min | ~60 ft/min |

TABLE B

EXEMPLARY AIR FLOW CALIBRATION

| ATM Cassette<br>Doors Open | Redirected<br>Air Flow | Non-Redirected<br>Air Flow |
| --- | --- | --- |
| Preferred Range | ~10–120 ft/min | ~30–120 ft/min |
| More Preferred<br>Range | ~30–60 ft/min | ~40–80 ft/min |
| Most Preferred | ~40 ft/min | ~50 ft/min |

Figure 2B:
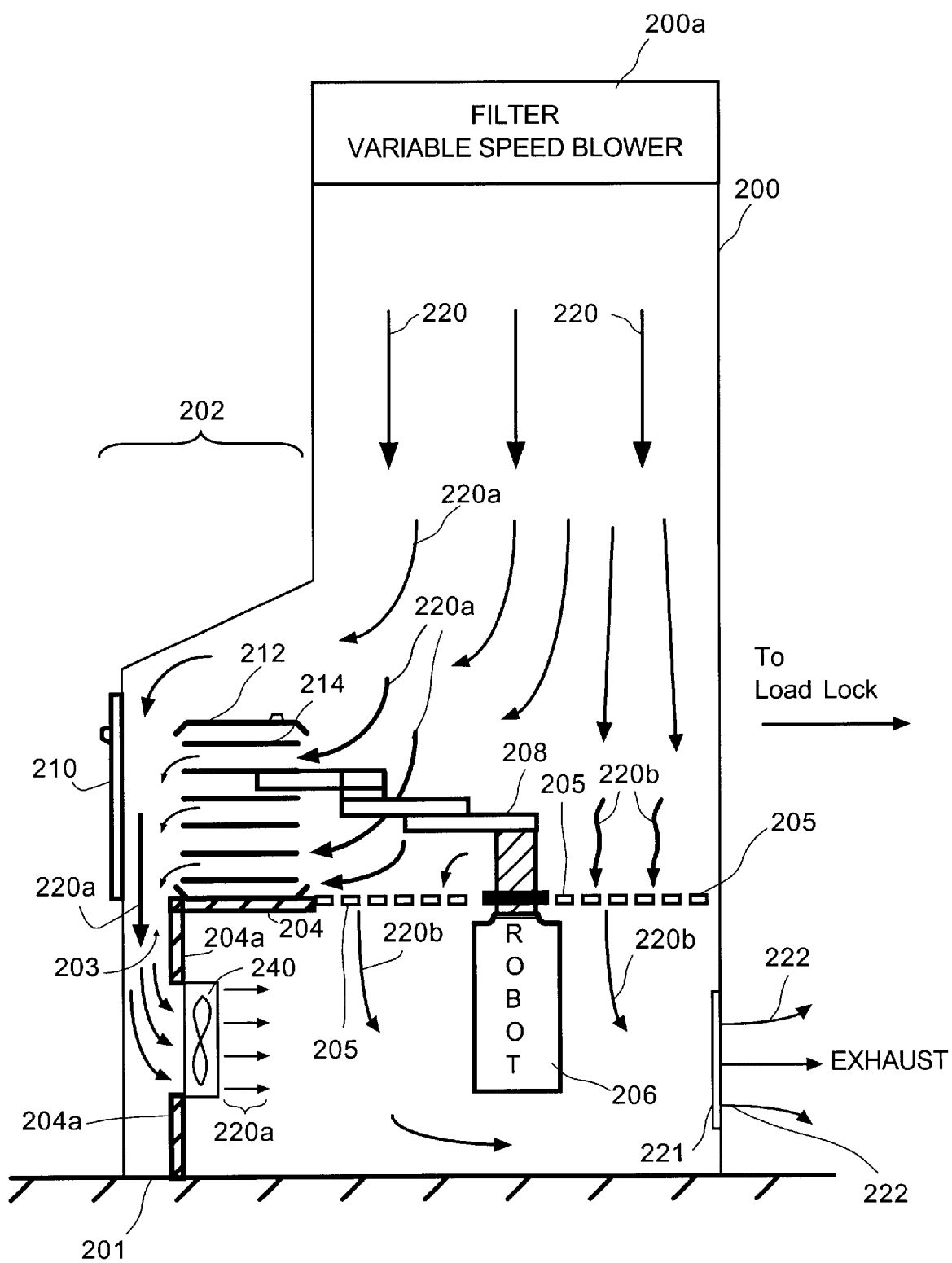
FIG. 2B illustrates another embodiment of the present invention in which the ATM includes a fan to further assist the redirected air flow through a redirection air flow slot and out a vent.

FIG. 2B illustrates another embodiment of the present invention in which the ATM 200 includes a fan 240 to further assist the redirected air flow 220a through the redirection air flow slot 203 and out the vent 221. As illustrated, the fan 240 is installed on a wall 204a which joins the shelf 204. The fan can be installed in any number of ways, so long as the redirected air flow 220a is assisted through the slot 203. As such, by installing the fan 204, additional suction is created through the redirection air flow slot 203 such that processed gasses and by-products found between the wafers 214 can be pulled through the redirection air flow slots 203 and pumped out as fan air flow 220a'. As previously stated, the fan is preferably switched off when the doors are opened to prevent "dirty" clean room air from being pulled in.

Figure 3A:
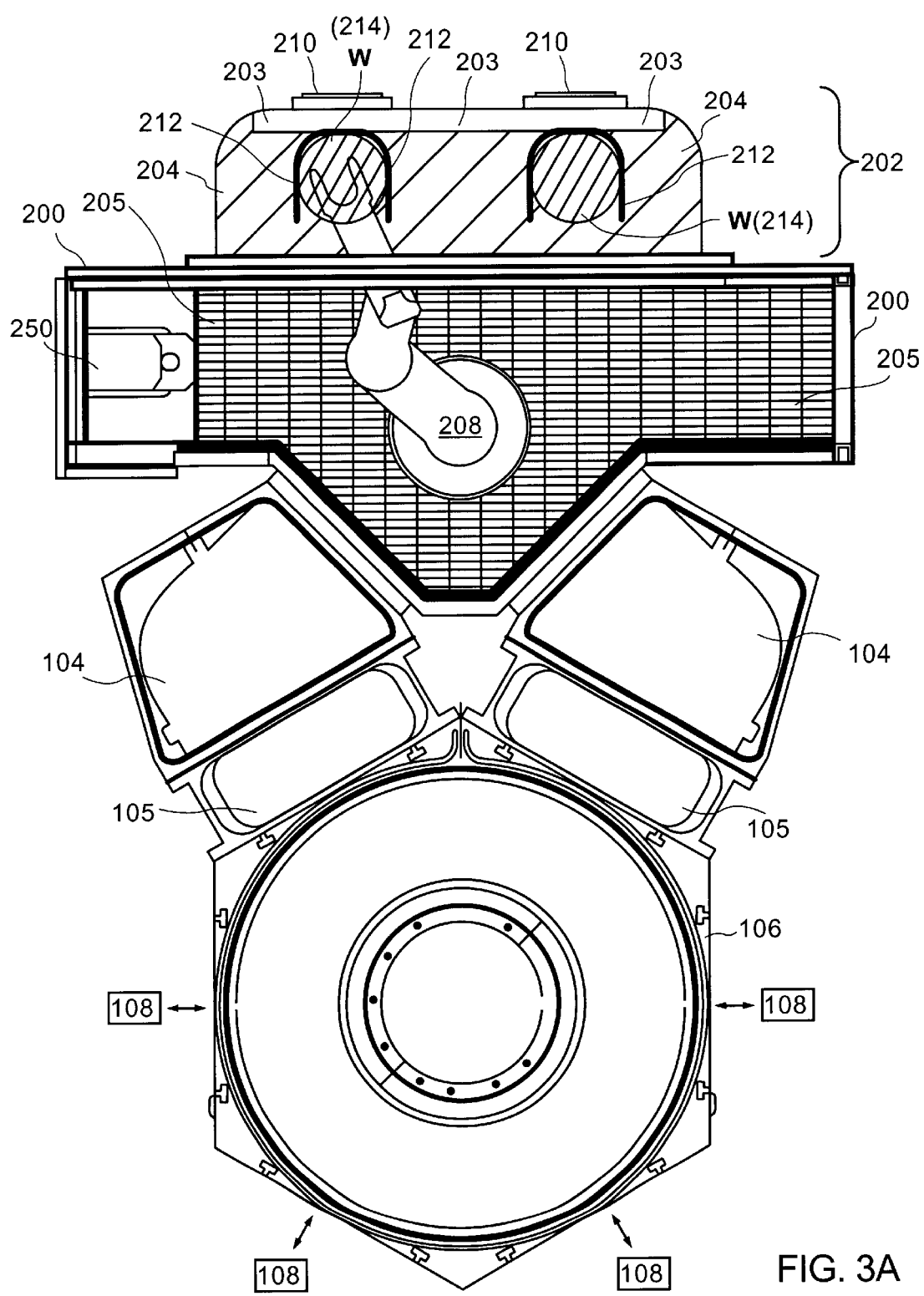
FIG. 3A shows a top view of the ATM that is connected to a process system, in accordance with one embodiment of the present invention.

FIG. 3A shows a top view of the ATM 200 that is connected to a process system, in accordance with one embodiment of the present invention. The architectural geometries of the ATM 200 and the arrangement of the robot with respect to the load locks 104 are described in greater detail a co-pending U.S. patent application having application Ser. No. 09/342,669, entitled "Atmospheric Wafer Transfer Module with Nest For Wafer Transport Robot and Method of Implementing Same," and filed on Jun. 29, 1999. This application is hereby incorporated by reference. As shown, the ATM 200 is designed to communicate with a pair of load locks 104. The load locks 104 are coupled to a transport chamber 106 by way of gate valves 105. The transport chamber 106 is then capable of coupling up to processing modules 108. A robot arm (not shown) is installed in the transport chamber 106 for retrieving wafers from within the load locks 104 and inserting them into selected processing modules 108, where processing operations are performed.

The ATM 200 is shown having an aligner 250 where wafers can be aligned on the arm set 208 before they are inserted into the load locks 104. The load cell 202 is shown having the shelf 204 which supports the cassette 212. The cassettes 212 are shown having wafers 214. Behind the cassettes 212 at the level of the shelf 204 is the redirection air flow slot 203 discussed with reference to FIG. 2A and 2B above. The doors 210 thus allow access to insert and remove the cassette 212 from within the load cell 202. The cassettes can be inserted and removed by either an external clean room robot (not shown) or a human.

In this embodiment, the ATM 200 is shown having a grid-like perforated sheet 205. The perforated sheet 205 can be selected to allow more or less of an air flow through the wafers 214 and through the redirection air flow slot 203. Although the ATM 200 is shown having a geometric shape for connecting angled load locks 104, it should be understood that any number of shapes will also work to enable proper redirection of air flow. The redirection is primarily a result of restricting the air flow through the perforated sheet 205 and thus redirecting at least part of the air flow toward the shelf 204 and any wafers in the cassettes 212.

Figure 3B:
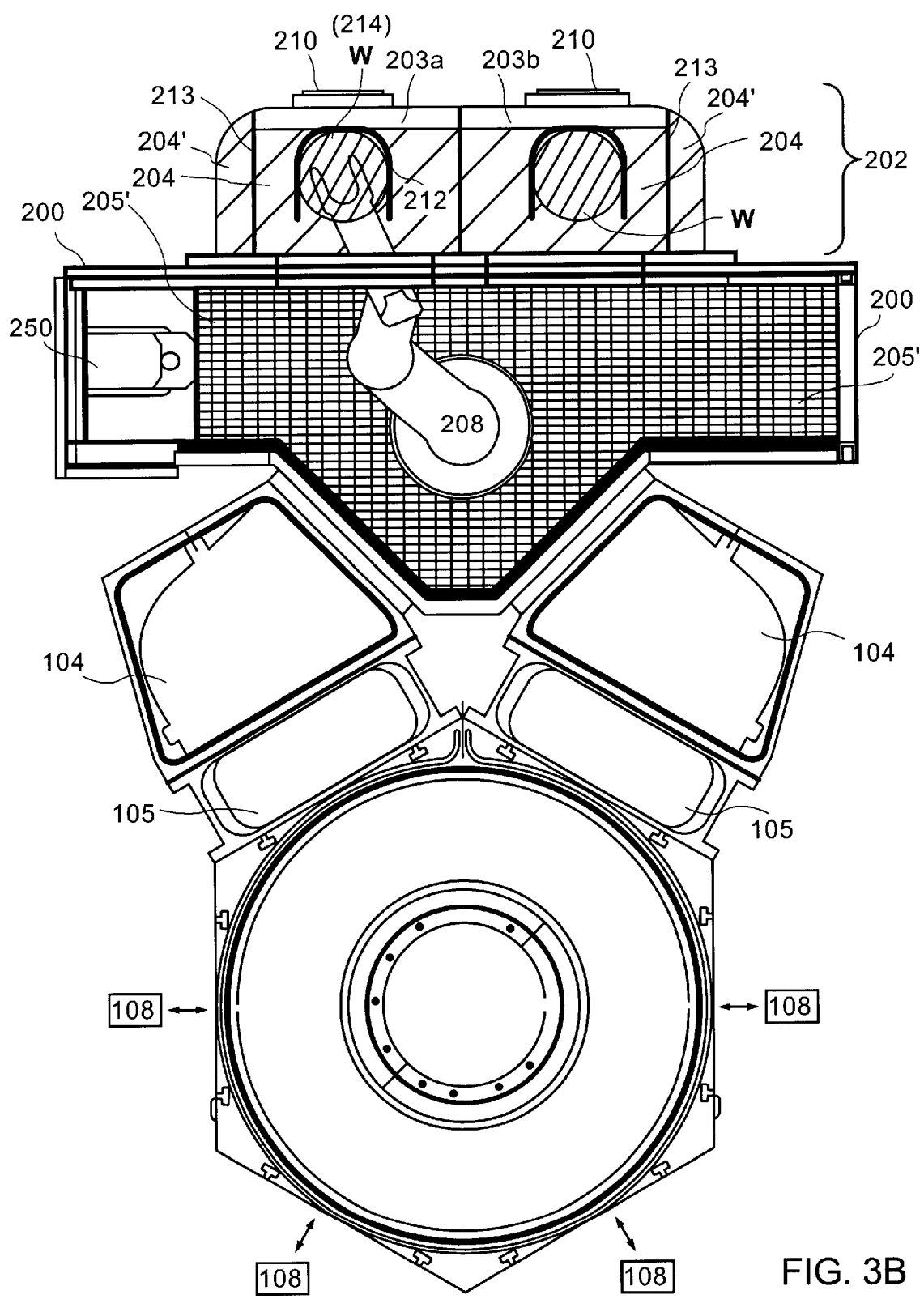
FIG. 3B illustrates another embodiment of the present invention in which the load cell and the perforated sheet have been modified.

FIG. 3B illustrates another embodiment of the present invention in which the load cell 202 and the perforated sheet 205' have been modified. As illustrated, the perforated sheet 205' has a more dense grid arrangement which is configured to reduce or restrict the air flow through the perforated sheet 205' and redirect more of the flow through the wafers 214 and down through the redirection air flow slots. The load cell 202 has also been modified to include an environment separator 207 that isolates one cassette 212 from the other. In addition, each of the cassettes 212 are also enclosed with sidewalls 213.

By including the environment separator 207 and the sidewalls 213, it is possible to more precisely control the mini-environment for each of the cassettes 212 when opening of a particular door 210 is desired to remove or insert a particular cassette 212. That is, when one of the doors 210 is opened to remove or insert one of the cassettes 212, the change in pressure within the opened mini-environment will not substantially affect the adjacent mini-environment in the neighboring cell which may have a number of processed wafers. It is also important to note that the environment separator assists in blocking particle migration and cross-contamination between the cells. Each of the load cells 202 will also preferably include a first redirection air flow slot 203a and a second redirection air flow slot 203b, respectively.

Figure 3C:
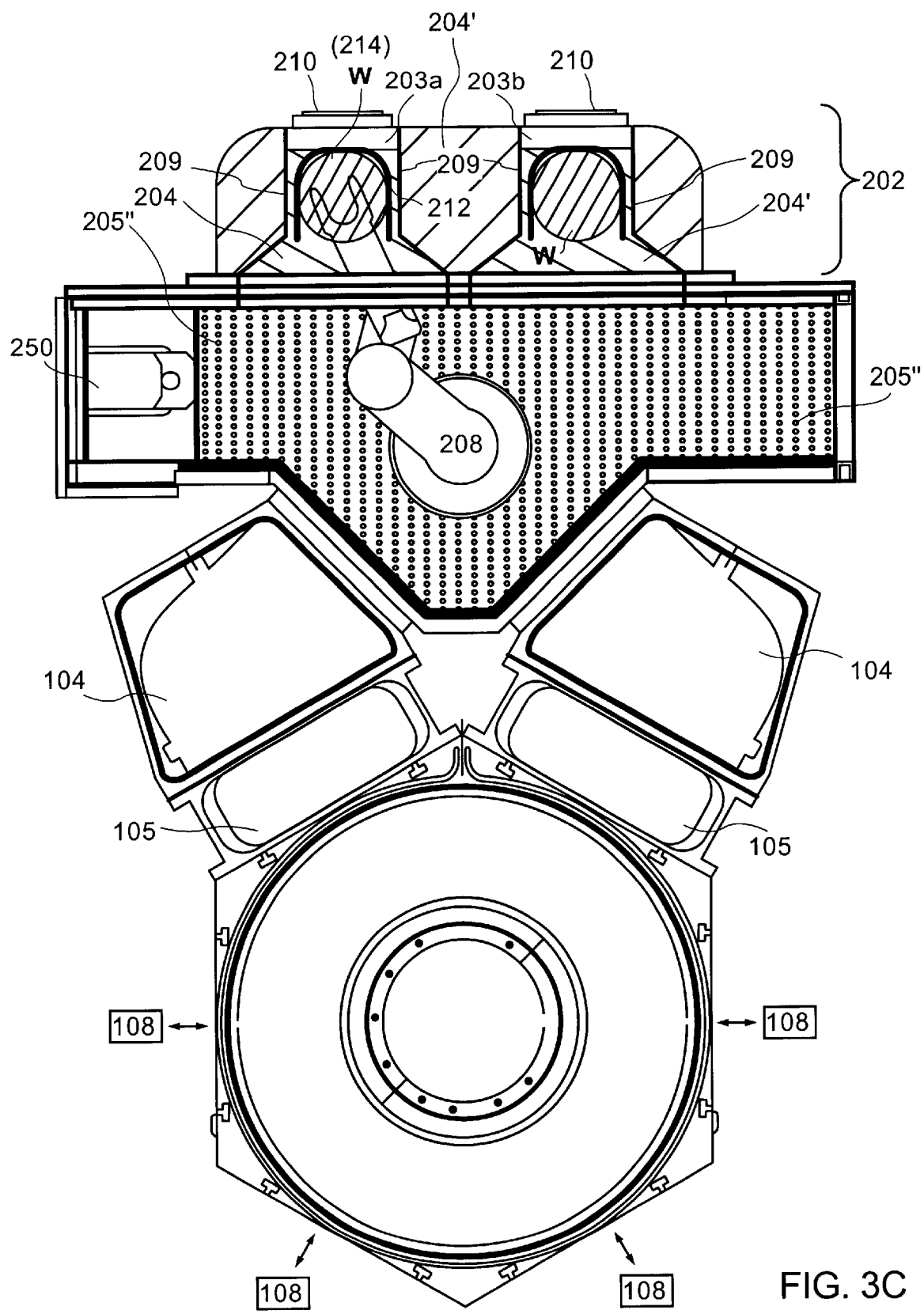
FIG. 3C illustrates another embodiment of the present invention in which the perforated sheet and the load cell have yet another modified structure.

FIG. 3C illustrates another embodiment of the present invention in which the perforated sheet 205" and the load cell 202 have a modified structure. In this embodiment, the perforated sheet 205" is defined as a sheet having a plurality of bored holes that can be adjusted to achieve the desired air flow through the perforated sheet 205". In one exemplary embodiment, the bored holes in the perforated sheet 205" can be configured to define a sheet that is between about 20% open, and about 80% open, and more preferably, between about 40% open, and about 70% open, and most preferably, about 63% open. To achieve an about 63% open characteristic, one embodiment has the holes bored staggered on 3/16 centers and having 5/32 diameter holes. In general, the open percentage is configured to achieve the desired mean velocity as discussed with reference to Tables A and B. As in the above embodiments, the perforated sheet 205" is preferably made of stainless steel which has been electro-polished to prevent corrosion and suppress electro-static charges.

In this example, the load cell 202 has been modified with cassette enclosures 209 which are configured to narrowly enclose the cassettes 212 when they are placed into position within the shelves 204 but flare out as they extend toward the perforated sheet 205". In this manner, the cassette enclosures 209 will allow the redirected air flow 220a to flow substantially through the wafers 212 and out the first and second redirection air flow slots 203a and 203b. The cassette enclosures 209 are preferably in the form of walls which enclose the cassettes 212. Outside of the cassette enclosures 209 is the remainder of the shelf 204'. Preferably, the entire inner surface of the cassette enclosures 209 are made of stainless steel that has been electro-polished to prevent corrosion and reduced the potential for electrostatic charges.

Although the foregoing invention has been described in some detail for purposes of clarity of understanding, it will be apparent that certain changes and modifications may be practiced within the scope of the appended claims. For instance, although the ATM has been described to have a particular geometry with regard to the load locks and an internal robot, it should be understood that the region of the perforated sheet can have any geometry, such as rectangular, square, and the like. In addition, the structure around each of the wafer cassettes can take on any number of shapes. Of particular significance, however, is the fact that the flow of air that is directed downward toward the perforated sheet is partially redirected toward the wafer cassettes, thus creating a mini-environment in and around the wafers which continually provides a gentle flow of air over the surfaces of the wafers. Accordingly, the present embodiments are to be considered as illustrative and not restrictive, and the invention is not to be limited to the details given herein, but may be modified within the scope and equivalents of the appended claims.

What is claimed is:

1. An atmospheric transport module, comprising:
    a housing, including,
        a top portion having a blower for generating a regulated air flow in a downward direction that is away from the top portion;
        a load cell region being laterally offset from the blower, the load cell region including a shelf for supporting a wafer cassette, the shelf being separated from a wall of the load cell region to define a redirection air flow slot; and
        a perforated sheet defined below the blower, the perforated sheet being configured to restrict air flow through the perforated sheet and further being configured to induce a redirected air flow toward and at least partially through the wafer cassette.

2. An atmospheric transport module as recited in claim 1, wherein the atmospheric transport module is configured to be connected to one or more load lock chambers.

3. An atmospheric transport module as recited in claim 2, further comprising:
    a robot having an arm set for transferring wafers between the wafer cassette and the one or more load lock chambers.

4. An atmospheric transport module as recited in claim 1, wherein the perforated sheet is selected to restrict an amount of air flow, the induced redirected air flow is adjusted depending on the amount of air flow restricted by the perforated sheet and the speed of the regulated air flow from the blower.

5. An atmospheric transport module as recited in claim 4, wherein the redirected air flow through the wafer cassette is at least partially parallel to one or more wafers that can be contained in the wafer cassette.

6. An atmospheric transport module as recited in claim 5, wherein the redirected air flow that travels through the wafer cassette is channeled through the redirection air flow slot to a region under the shelf and the perforated sheet.

7. An atmospheric transport module as recited in claim 6, wherein the air flow from the blower that is restricted by the perforated sheet at least partially flows as non-redirected air flow through the perforated sheet and into the region under the shelf and the perforated sheet.

8. An atmospheric transport module as recited in claim 7, wherein the redirected air flow and the non-redirected air flow that is channeled into the region under the shelf and the perforated sheet is exhausted out of the region of the atmospheric transport module through a vent.

9. An atmospheric transport module as recited in claim 7, wherein the redirected air flow has a mean velocity ranging between about 10 feet per minute and about 80 feet per minute and the non-redirected air flow has a mean velocity ranging between about 40 feet per minute and about 120 feet per minute.

10. An atmospheric transport module as recited in claim 1, wherein the load cell has at least one door for inserting and removing the wafer cassette.

11. An atmospheric transport module as recited in claim 1, further comprising:
    a fan positioned below the shelf, the fan being configured to pull on the redirected air flow through the redirection air flow slot and into a region defined under the shelf and the perforated sheet;
    an interlocking mechanism coupling the fan to a door of the load cell, such that the fan is switched off when the door of the load cell is opened.

12. An atmospheric transport module as recited in claim 10, wherein a vent is defined under the shelf and the perforated sheet for removing air flow from the housing.

13. An atmospheric transport module as recited in claim 1, wherein the housing further includes,
    a filter integrated with the blower.

14. An atmospheric transport module as recited in claim 1, wherein the wafer cassette is an open cassette.

15. An atmospheric transport module as recited in claim 1, wherein internal portions of the housing defined above the perforated sheet and including the perforated sheet are made of electro-polished stainless steel.

16. An atmospheric transport module as recited in claim 1, wherein the shelf of the load cell is configured to support one or more of the wafer cassettes.

17. An atmospheric transport module as recited in claim 16, wherein the one or more wafer cassettes are individually enclosed by separation walls.

18. An atmospheric transport module, comprising:
    an enclosed housing having a top region, a central region, a bottom region, and a load cell region;
    a blower located in the top region of the enclosed housing and being configured to generate a flow of air downward into the central region;
    a shelf defining a separation between the central region and the bottom region of the enclosed housing, the shelf being at least partially spaced apart from a wall of the load cell region and thereby defining a slot, the load cell region being laterally offset from the blower; and
    a perforated sheet extending from the shelf and further defining the separation between the central region and the bottom region;
    whereby air flow generated by the blower is restricted from freely flowing through the perforated sheet and is partially caused to be redirected toward the shelf of the load cell region, through the slot and into the bottom region of the enclosure housing.

19. An atmospheric transport module as recited in claim 18, wherein a wafer cassette having one or more wafers is configured to sit on the shelf of the load cell region.

20. An atmospheric transport module as recited in claim 19, wherein the air flow that is caused to be redirected toward the shelf partially flows substantially parallel to the one or more wafers of the wafer cassette.

21. An atmospheric transport module as recited in claim 20, wherein the air flow that is caused to be redirected toward the shelf assists in partially removing process gases form the surfaces of the one or more wafers of the wafer cassette.

22. An atmospheric transport module as recited in claim 20, wherein the air flow that is caused to be redirected toward the shelf assists in partially removing particles form the surfaces or airborne over the surfaces of the one or more wafers of the wafer cassette.

23. An atmospheric transport module as recited in claim 19, wherein wall enclosures are defined within the load cell and around the shelf to individually contain the wafer cassette, and the slot is defined at a back wall of the wall enclosures.

24. An atmospheric transport module as recited in claim 18, wherein the air flow that that is partially caused to be redirected toward the shelf is a redirected air flow and the air flow that passes through the perforated sheet is non-redirected air flow.

25. An atmospheric transport module as recited in claim 24, wherein the redirected air flow has a mean velocity ranging between about 10 feet per minute and about 80 feet per minute and the non-redirected air flow has a mean velocity ranging between about 40 feet per minute and about 120 feet per minute.

26. A method of making an atmospheric transport module, comprising:

forming an enclosed housing having a top region, a central region, a bottom region, and a load cell region;

installing a blower in the top region of the enclosed housing, the blower being configured to generate a flow of air downward into the central region;

installing a shelf that defines a horizontal separation between the central region and the bottom region of the enclosed housing, the shelf being at least partially spaced apart from a wall of the load cell region and thereby defining a slot, the load cell region being laterally offset from the blower; and installing a perforated sheet extending horizontally from the shelf and further defining the separation between the central region and the bottom region, the air flow generated by the blower is restricted from freely flowing through the perforated sheet and is partially caused to be redirected away from the perforated sheet and toward the shelf of the load cell region, through the slot and into the bottom region of the enclosure housing.

27. A method of making an atmospheric transport module as recited in claim 26, wherein a wafer cassette having one or more wafers is configured to sit on the shelf of the load cell region.

28. A method of making an atmospheric transport module as recited in claim 27, wherein the air flow that is caused to be redirected toward the shelf partially flows substantially parallel to the one or more wafers of the wafer cassette.

29. A method of making an atmospheric transport module as recited in claim 28, wherein the air flow that is caused to be redirected toward the shelf assists in partially removing process gases airborne over the surfaces of the one or more wafers of the wafer cassette.

30. A method of making an atmospheric transport module as recited in claim 28, wherein the air flow that is caused to be redirected toward the shelf assists in partially removing particles form the surfaces of the one or more wafers of the wafer cassette.

31. A method of making an atmospheric transport module as recited in claim 26, wherein the perforated sheet has a grid arrangement and the perforated sheet is electro-polished stainless steel.

32. A method of making an atmospheric transport module as recited in claim as recited in claim 26, wherein the perforated sheet has a plurality of bored holes and the perforated sheet is electro-polished stainless steel.

* * * * *